United States Patent
Aratani et al.

(10) Patent No.: US 6,972,076 B1
(45) Date of Patent: Dec. 6, 2005

(54) THIN FILM FORMATION USE SPUTTERING TARGET MATERIAL, THIN FILM FORMED USING SAME, AND OPTICAL RECORDING MEDIUM

(75) Inventors: Katsuhisa Aratani, Chiba (JP); Takashi Ueno, Tokyo (JP)

(73) Assignees: Sony Corporation, Tokyo (JP); Furuyametals Co., Ltd., Tokyo (JP)

( * ) Notice: Subject to any disclaimer, the term of this patent is extended or adjusted under 35 U.S.C. 154(b) by 0 days.

(21) Appl. No.: 09/429,719

(22) Filed: Oct. 29, 1999

(51) Int. Cl.[7] ............................................. C23C 14/34
(52) U.S. Cl. ............................. 204/192.15; 204/192.2; 204/192.26; 204/192.27
(58) Field of Search ..................... 204/192.15, 192.17, 204/192.2, 192.26, 192.27

(56) References Cited

U.S. PATENT DOCUMENTS

| | | | |
|---|---|---|---|
| 4,647,947 A | * 3/1987 | Takeoka et al. | 346/135.1 |
| 5,948,497 A | 9/1999 | Hatwar et al. | 428/64.2 |
| 6,004,646 A | * 12/1999 | Ohno et al. | 428/64.1 |
| 6,007,889 A | * 12/1999 | Nee | 428/64.1 |

* cited by examiner

Primary Examiner—Rodney G. McDonald

(74) Attorney, Agent, or Firm—Sonnenschein, Nath & Rosenthal LLP

(57) ABSTRACT

An alloy material, a thin film and an optical recording medium to achieve various tasks such as maintenance of a high reflectivity, improved corrosion resistance, simplified production of the alloy, and realization of stability and simplicity/easiness of a sputtering process when being used as a sputtering target. An AgPd alloy including Ag as a main component and Pd in the range of 0.5 to 4.9 atomic % is used as a thin film formation use sputtering target material, with the target material a thin film, that is a reflecting film, constituting an optical recording medium is formed and the optical recording medium containing the reflecting film as a constituent is produced.

4 Claims, 1 Drawing Sheet

THIN FILM FORMATION USE SPUTTERING TARGET MATERIAL, THIN FILM FORMED USING SAME, AND OPTICAL RECORDING MEDIUM

BACKGROUND OF THE INVENTION

1. Field of the Invention

The present invention relates to thin film formation using a sputtering target material, a thin film formed by using the same target material and an optical recording medium.

2. Description of the Related Art

Al and Al alloys have generally been known as material for reflecting film applied to optical recording media including optical discs such as a CD (Compact Disc), a DVD (Digital Versatile Disc) or the like, a magneto optical disc such as a MD (Mini Disc) and MO (Magnetic Optical Disc) or the like or writeable optical recording media such as a phase change optical disc or the like.

Al and Al alloys each can show a reflectivity equal to or higher than a certain value in a specific optical wavelength region when reproducing recorded information with the above described various optical recording media and are excellent in thermal conduction characteristics.

Furthermore, stable coverage can be attained by the Al and Al alloy in grooves with fine recesses and protrusions formed on an optical recording medium and in addition, as an optical recording medium product, excellent resistance to corrosion caused by non-metal elements contained in the air surrounding the product, which leads to an advantage that a change in properties through a long time is very small.

A thin film formed using Al or Al alloys, however, cannot be said to have a sufficiently high reflectivity according to an application of an optical recording medium at present, since a reflectivity of the thin film is on the order of 80% for light with a wavelength of 800 nm, for example.

On the other hand, in a CD-R (Compact Disc-Recordable), when a reflecting film is formed using Al based material, a sufficiently high reflectivity has not been obtained and therefore, application of Au as material of a reflecting film has been studied.

Au, however, has a problem since the element is costly as material of a thin film and therefore, as an alternatives of Au, Ag or Cu has been studied.

Ag, however, has a problem in regard to weatherability in a specific environment such as in sea water or the like since the element Ag is chemically active with non-metal elements such as chlorine, oxygen, sulfur or the like, and ions of the nonmetal elements.

On the other hand, there have been disclosed techniques in the publications of Unexamined Japanese Patent Applications Nos. Sho 57-186244, Hei 7-3363 and Hei 9-156224 in which weatherability is improved by addition of a given impurity to Ag.

That is, in the publication of Unexamined Japanese Patent Application No. Sho 57-186244, a technique is disclosed regarding an Ag—Cu alloy including an Ag content of 40 atomic % or more, in the publication of Unexamined Japanese Patent Application No. Hei 7-3363, a technique is disclosed regarding an Ag—Mg alloy including a Mg content equal to or more than a value in the range of 1 to 10 atomic % and in the publication of Unexamined Japanese Patent Application No. Hei 9-156224, a technique is disclosed regarding an AgOM alloy wherein M indicates Sb, Pd and Pt, an O content is in the range of 10 to 40 atomic % and an M content is in the range of 0.1 to 10 atomic %.

In the publications, however, compositions of elements constituting the alloy materials are shown in broad ranges and corrosion resistance and reflectivity of a formed thin film with contents of constituent elements of the alloy materials are not necessarily provided.

Especially, improvement of weatherability by addition of a trace of an impurity to Ag is not achieved at a sufficient level and furthermore, there remain many unclear points on reliability as a reflecting film required for adoption as an optical recording medium.

Besides, Mg is one of the alkaline earth metals and since an element of the kind or its ion is chemically unstable, an alloy prepared using the element has had requirement for improvement of weatherability to chlorine and the like.

SUMMARY OF THE INVENTION

Therefore, the present inventors have conducted serious studies on various tasks such as maintenance of a high reflectivity and improved corrosion resistance in comparison with Ag; realization of easy production of an alloy; and realization of stability and simplicity/easiness of a sputtering process when an alloy is used as a sputtering target with the result that a thin film formation using a sputtering target material, a thin film that is formed by using the material and an optical recording medium, with which the tasks can be achieved, have been able to be obtained.

In the present invention, an AgPd alloy including Ag as a main component and Pd in the range of 0.5 to 4.9 atomic % is used as a thin film formation using a sputtering target material, a thin film constituting an optical recording medium is formed by using the AgPd alloy and an optical recording medium containing the thin film as a constituent is attained.

Besides, in the present invention, an Ag alloy prepared by adding one or both of Cu and Cr in the range of 0.1 to 3.5 atomic % in content to an AgPd alloy including Pd in the range of 0.5 to 4.9 atomic % in content, or an Ag alloy including Pd in the range of 0.5 to 1.5 atomic % in content and Ti in the range of 0.1 to 2.9 atomic % in content is used as a thin film formation use sputtering target material, a thin film constituting an optical recording medium is formed by using the Ag alloy and an optical recording medium having the thin film as a constituent is attained.

According to an AgPd alloy of the present invention, when the AgPd alloy is used as a thin film formation use sputtering target material and as a material of a thin film of an optical recording medium, there can be realized not only increase in resistance to corrosion caused by non-metal elements such as chlorine, hydrogen, oxygen and sulfur, which contamination is studied in the air atmosphere or a specific environment; but improvement of high weatherability in an environment or atmosphere required when the film is adopted as a constituent of an optical recording medium, by interaction of resistances to hydrogen and oxygen of Ag, and resistances to chlorine and sulfur of Pd.

Other objects and advantages of the present invention will become apparent upon reading the following detailed description and appended claims, and upon reference to the accompanying drawings.

BRIEF DESCRIPTION OF THE DRAWINGS

The present invention is illustrated more or less diagrammatically in the accompanying drawing wherein.

Figure 1:
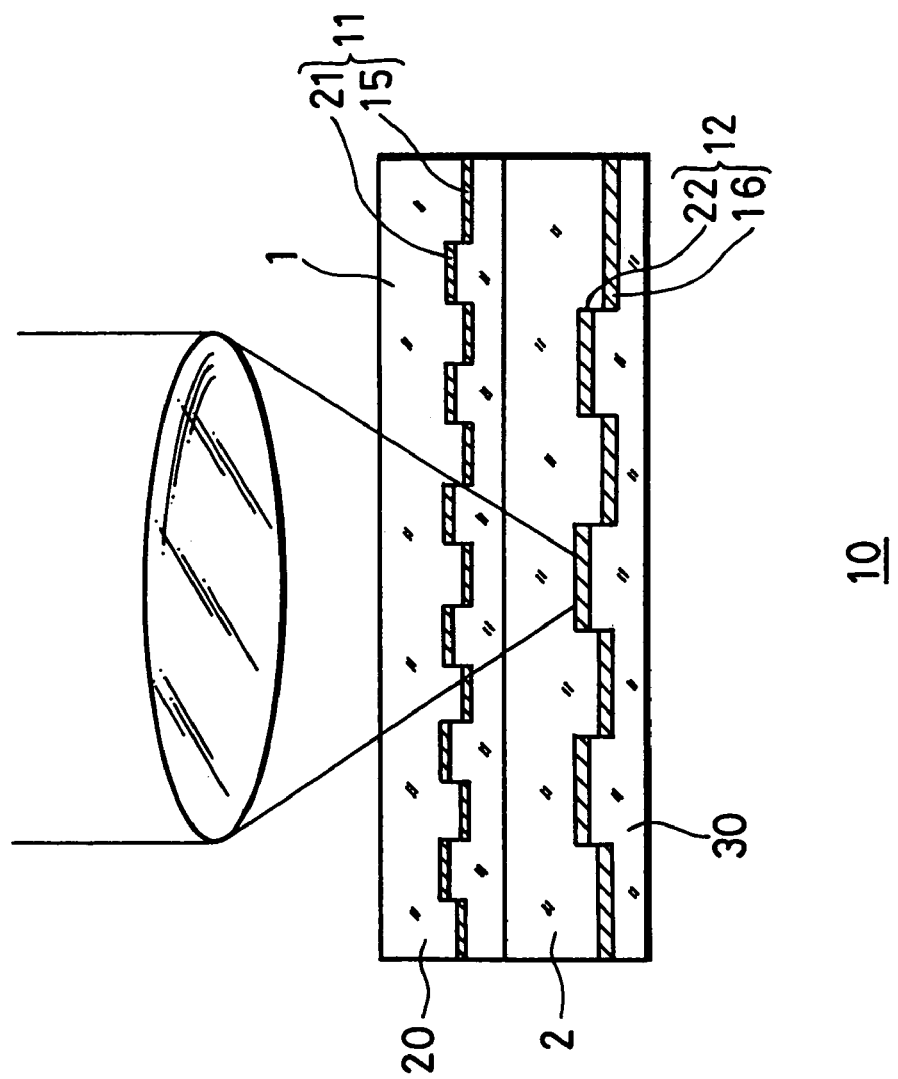
FIG. 1 shows a schematic sectional view of an optical recording medium with a two-layer structure as an example of an optical recording medium having a thin film formed by using a sputtering target material of the present invention.

It should be understood that the drawings are not necessarily to scale and that the embodiments are sometimes illustrated by graphic symbols, phantom lines, diagrammatic representations and fragmentary views. In certain instances, details which are not necessary for an understanding of the invention or which render other details difficult to perceive may have been omitted. It should be understood, of course, that the invention is not necessarily limited to the particular embodiments illustrated herein.

DETAILED DESCRIPTION OF THE PRESENTLY PREFERRED EMBODIMENTS

In the present invention, an AgPd alloy including Ag as a main component and Pd in the range of 0.5 to 4.9 atomic % is used as a thin film formation using a sputtering target material, a thin film constituting an optical recording medium is formed by using the AgPd alloy and an optical recording medium having the thin film as a constituent is attained.

Besides, in the present invention, an Ag alloy prepared by adding at least one of Cu or Cr each in the range of 0.1 to 3.5 atomic % in content to an AgPd alloy including Ag as a main component and Pd in the range of 0.5 to 4.9 atomic %, or an Ag alloy including Pd in the range of 0.5 to 1.5 atomic % and Ti in the range of 0.1 to 2.9 atomic % is used as a thin film formation using a sputtering target material, a thin film constituting an optical recording medium is formed by using the Ag alloy and an optical recording medium having the thin film as a constituent is attained.

Below, while description will be made of a case where a thin film formation using a sputtering target material, a thin film formed by using the target material and an optical recording medium containing the thin film are applied to an optical disc in the shape of a disc or a circular plate with a two information recording layer structure, it should be noted that the present invention is not limited to such an optical disc and a shape itself, but can be applicable to a magneto optical disc, a phase change disc, and other various kinds of optical recording media, respectively in the shapes of a card, a sheet and the like, having a metal thin film as an information layer.

An optical recording medium prepared in the following example is an optical recording medium with a two-layer structure, which is obtained by stacking, as shown in FIG. 1, a first substrate 1 and a second substrate 2 with, for example, a photo curable resin 20 having a light transmissivity interposed therebetween.

The first substrate 1 has first fine recesses and protrusions 21 such as data recording pits or pre-grooves on a main surface formed by injection molding of a light transmission resin such as polycarbonate or the like, for example, and a semi-transparent film 15 is formed thereon, which both form a first information record layer 11 on the first substrate 1. The second substrate 2 that is stacked on the first substrate 1, similar to the first substrate 1, has a second fine recesses and protrusions 22 such as data recording pits or pre-grooves on a main surface formed by injection molding of a light transmission resin such as polycarbonate or the like, for example, and a reflecting film 16 formed by using a silver alloy according to the present invention, which both form a second information layer 12 on the second substrate 2.

The reflecting film 16 made of the silver alloy can be formed, for example, by a RF (AC) magnetron sputtering method and a film thickness thereof is adjusted, for example, in the order of 50 to 150 nm.

Besides, a protective film 30 made of, for example, a ultra-violet curable acrylic based resin is formed on the second information recording layer 12.

In the optical recording medium with a two-layer structure shown in FIG. 1, when the information recorded in the second information recording layer 12 is reproduced, the second information recording layer 12 is irradiated with a light beam of a wavelength of 800 nm so that the light beam is focused on the second information layer 12.

On the other hand, when the information recorded in the first information recording layer 11 is reproduced, the first information recording layer 11 is irradiated with a light beam of a wavelength of 650 nm so that the light beam is focused on the first information layer 11.

Below, description will be made of the silver alloy according to the present invention, and a thin film formed by using the silver alloy, that is the reflecting film 16 shown in FIG. 1.

The present invention, as described above, has been made in order to achieve various tasks such as maintenance of a high reflectivity, improvement of weatherability, realization of easy production of alloy, and realization of stability and simplicity/easiness of a sputtering process when being used as a sputtering target and is to obtain a thin film formation using a sputtering target material of an AgPd alloy including Ag as a main component and Pd in the range of 0.5 to 4.9 atomic %, a thin film formed by using the alloy and an optical recording medium containing the thin film.

Besides, the present invention is to obtain a thin film formation using a sputtering target material of an Ag alloy prepared by adding one or two of Cu and Cr each in the range of 0.1 to 3.5 atomic % in content to an AgPd alloy including Ag as a main component and Pd in the range of 0.5 to 4.9 atomic %, or an Ag alloy composed of Pd in the range of 0.5 to 1.5 atomic % and Ti in the range of 0.1 to 2.9 atomic %, a thin film formed by using the alloy and an optical recording medium containing the thin film.

As the reasons why Pd is especially selected as an addictive to an Ag alloy sputtering target material, it is first taken up that a specific gravity of silver is 10.491 g/cm$^3$ and that of Pd is 12.2 g/cm$^3$, which shows there is vary small difference in specific gravity between both elements.

If, in this way, a specific gravity difference is small, segregation of Pd as an additive element in the whole bulk of an alloy can be suppressed during the melting process and the cooling/solidification in production of the alloy. Furthermore, there is an advantage that no intermetallic compound is formed in an alloying process.

Ag is apt to chemically combine with sulfur and when Ag is left in the atmosphere for a long period of time, a surface that is exposed to the atmosphere reacts with sulfur to produce silver sulfide ($Ag_2S$) and the surface is blackened to degrade a reflecting characteristic. Besides, Ag also violently reacts with chlorine to produce silver chloride (AgCl), which causes the surface to be cloudy and deteriorate a reflecting characteristic. A part reacting with chlorine further grows and expands, and the cloudy part also expands, which further affects a reflecting characteristic in an adverse manner with the result that physical properties of Ag are spoiled.

However, on the other hand, Ag is a material that is comparatively stable with oxygen and hydrogen, and especially stable with hydrogen, and it can also be found that a reactivity of Ag with the elements is stable by confirming a bonding state with oxygen after Ag is left in an oxygen atmosphere for a long period of time and a bonding state with hydrogen after Ag is left in water in an immersed manner. Hence, to utilize its barrier effect to oxygen and hydrogen, Ag is applied as an additive to a photosensitive material and used in a high melting point solder and the like.

On the other hand, Pd has resistance to reactions with sulfur and chlorine as long as temperature is not high and therefore, the element Pd is a chemically stable element to chlorine and sulfur. Since Pd has a characteristic to occlude well and activate hydrogen and therefore a trace of Ti is in many cases added to Pd as a barrier material to hydrogen when a plate member is produced in a melting method.

As described above, when an Ag—Pd alloy is prepared by adding a given quantity of Pd to Ag and dispersing the Pd into grain boundaries of the Ag bulk in a uniform manner, there can be realized not only increase in resistance to contamination caused by non-metal elements such as chlorine, hydrogen, oxygen and sulfur, which contamination is studied in the air atmosphere or a specific environment; but improvement of high weatherability, as compared with Ag, in an environment or atmosphere required when the film is adopted as a constituent of an optical recording medium, by interaction of resistances to hydrogen and oxygen of Ag, and resistances to chlorine and sulfur of Pd.

Then, thin films for optical recording media, that is reflecting films therefor were formed by using Ag—Pd alloys, in which given amounts of Pd were respectively added to Ag, to prepare optical recording media and a reflectivity for a laser light with a given wavelength on each of the optical recording media was measured.

In this case, thin film formation use sputtering target materials made of AgPd alloys having Pd contents of 0.1, 0.5, 1.0, 1.5, 2.0, 2.5, 3.0, 3.5, 4.0, 4.5 and 5.0 in atomic % were used to form thin films of optical recording media, that is, reflecting films thereof. Optical recording medial were thus prepared. Thus prepared optical recording media were measured on reflectivity under irradiation of laser light of wavelengths of 800, 600 and 400 nm and results are shown in the below described table (Table 1).

TABLE 1

| Pd composition [atomic %] | Wavelength 800 nm Reflectivity [%] | Wavelength 600 nm Reflectivity [%] | Wavelength 400 nm Reflectivity [%] |
|---|---|---|---|
| 0.1 | 93.6 | 92.3 | 88.7 |
| 0.5 | 93.1 | 92.1 | 84.4 |
| 1.0 | 92.2 | 89.2 | 77.6 |
| 1.5 | 92.1 | 86.0 | 71.1 |
| 2.0 | 92.0 | 85.8 | 70.8 |
| 2.5 | 91.3 | 85.4 | 70.4 |
| 3.0 | 91.1 | 84.2 | 69.3 |
| 3.5 | 90.6 | 83.0 | 66.3 |
| 4.0 | 90.2 | 82.2 | 63.6 |

TABLE 1-continued

| Pd composition [atomic %] | Wavelength 800 nm Reflectivity [%] | Wavelength 600 nm Reflectivity [%] | Wavelength 400 nm Reflectivity [%] |
|---|---|---|---|
| 4.5 | 89.5 | 81.3 | 63.1 |
| 5.0 | 87.7 | 81.1 | 63.1 |

It can be seen from the measurement results shown in Table 1 that in a case where thin films of optical recording media were formed by using thin film formation use sputtering target materials made of AgPd alloy including Ag as a main component and Pd in the range of 0.5 to 4.9 in atomic %, a high reflectivity that is desirable in a practical phase is attained.

That is, it can be seen that in a case where thin films of optical recording media, as shown in Table 1, are formed by using thin film formation use sputtering target materials made of AgPd alloy having Pd contents in the range of 0.5 to 4.9 in atomic % and especially, the laser light with the wavelength of 800 nm is used for irradiation, a high reflectivity of 88% or higher can be obtained on each of specimens and the thin films each have an excellent characteristic as an reflecting film of an optical recording medium.

It can be assumed that in a case where thin film formation use sputtering target materials made of AgPd alloy including Ag as a main component and Pd in the range of 0.5 to 4.9 in atomic % are used as materials for forming reflecting films of optical recording media, reduction in average reflectivity of the thin films can be suppressed roughly to the maximum value of 4 to 5% in measurement with a laser beam of a wavelength in the same region, compared with a case where Ag is singly used as a material for forming a reflecting film. Besides, weatherability, which is an important property of a reflecting film of an optical recording medium, can further be improved by including Pd, compared with the case where Ag is singly used as a material for forming a reflecting film.

Then, AgPdX alloys, wherein X indicates Cu or Cr, were prepared by adding any one of Cu or Cr each in the range of 0.1 to 3.5 atomic % in content to an AgPd alloy including Ag as a main component and Pd in the range of 0.5 to 4.9 atomic % and, with such alloys, reflecting films of optical recording media were prepared to produce the optical recording media. The reflectivities of reflecting films in the case were measured with laser light of a given wavelength.

In this case, a reflectivity of each of specimens was measured with laser light of wavelengths of 800, 600 and 400 nm and results of the measurement are shown in Table 2 described below.

TABLE 2

| X element | Quantity of X element [atomic %] | Pd composition [atomic %] | Wavelength 800 nm Reflectivity[%] | Wavelength 600 nm Reflectivity[%] | Wavelength 400 nm Reflectivity[%] |
|---|---|---|---|---|---|
| Ta | 3.5 | 1.5 | 75.5 | 70.1 | 60.7 |
| Cr | 3.5 | 1.5 | 91.9 | 86.7 | 73.1 |
| Ti | 3.5 | 1.5 | 87.2 | 81.4 | 64.9 |
| Cu | 3.5 | 1.5 | 92.4 | 87.2 | 70.8 |
| Cu | 1.2 | 1.5 | 92.8 | 90.1 | 79.5 |

TABLE 2-continued

| X element | Quantity of X element [atomic %] | Pd composition [atomic %] | Wavelength 800 nm Reflectivity[%] | Wavelength 600 nm Reflectivity[%] | Wavelength 400 nm Reflectivity[%] |
|---|---|---|---|---|---|
| Cu | 1.9 | 1.0 | 93.5 | 90.6 | 80.2 |
| Cu | 2.1 | 1.1 | 93.4 | 90.1 | 79.6 |

It can be seen as shown in Table 2 that in a case where thin films of optical recording media, as shown in Table 2, are produced by using a thin file formation use sputtering target material or an AgPdX alloy, wherein X indicates Cu and Cr, prepared by adding any one of Cu or Cr each in the range of 0.1 to 3.5 atomic % in content to an AgPd alloy including Pd in the range of 0.5 to 4.9 atomic % in content, or an Ag alloy including Pd in the range of 0.5 to 1.5 atomic % in content and Ti in the range of 0.1 to 2.9 atomic % in content, a high reflectivity desirable in a practical phase can be attained.

That is, in a case where thin films of optical recording media, as shown in Table 2, are prepared by using a thin film formation use sputtering target material or an AgPdX alloy, wherein X indicates Cu and Cr, prepared by adding any one of Cu or Cr each in the range of 0.1 to 3.5 atomic % in content to an AgPd alloy including Pd in the range of 0.5 to 4.9 atomic % in content, or an Ag alloy including Pd in the range of 0.5 to 1.5 atomic % in content and Ti in the range of 0.1 to 2.9 atomic % in content and laser light of a wavelength of 800 nm is especially used for illumination, a high reflectivity of 88% or higher can be obtained on each of specimens and the thin films each having an excellent characteristic as the reflecting films of optical recording media can be attained.

While, in the above description, the examples in which one of the elements of Cu and Cr is included in the AgPd alloy are described, the present invention is not limited to the examples, but it was confirmed that an alloy prepared by adding the two kinds of Cu and Cr at each content in the range of 0.1 to 3.5 atomic % to the AgPd alloy also exerted a similar effect to that of the AgPd alloy including Cu or Cr.

Besides, it was confirmed that an alloy prepared by adding Ti in the range of 0.1 to 2.9 atomic % in content to an AgPd alloy including Ag as a main component and Pd in the range of 0.1 to 1.5 in atomic % also exerted a similar effect.

While, in Table 2, the cases where one element of Cu, Ti and Cr is included in an AgPd is described, the present invention is not limited to the examples, but it was confirmed that the present invention was also able to be applied to an AgPd alloy including one element, or two or more elements of other metals than Cu, Ti and Cr, for example Au, Al and Rh. It was further confirmed that a high reflectivity was be able to be attained on each of specimens using AgPd alloys containing the other metals and the thin films each having an excellent characteristic as the reflecting films of optical recording media were be able to be attained.

Then, description will be made of a sputter rate in a case where a thin film for an optical recording medium, that is, a reflecting film thereof, is formed by using an AgPd alloy of the present invention while comparing with a sputter rate in a case where a reflecting film is formed by using Ag singly.

For example, a cylinder with a diameter of 76.2 nun and a height of 6 mm made of an AgPd alloy including Pd, for example, of 2 atomic % in content is prepared.

Then, for example, cylinders each with a diameter of 76.2 mm and a height of 6 mm respectively made of pure metals of Au, Al, Cu, Ti, Rh and Cr are prepared.

Cylinders are set in a sputtering apparatus, and an AgPd alloy and each of the pure metals of Au, Al, Cu, Ti, Rh and Cr, which are used as a second additive element, are simultaneously subjected to discharge to form a ternary alloy (hereinafter referred to as AgPdX).

In this case, reflecting films of Ag singly, an AgPd alloy singly, Al and Au as well, the latter two of which are considered as alternatives of the former two, are formed and respective sputter rates are measured, which measurements are used as references in comparison between rate differences.

A thickness of each of deposited reflecting films was set to 1000 Å and the films were deposited by a RF magnetron sputtering method. An AgPdX alloy included an X metal of 3 atomic % in content, for example.

Sputtering conditions were that the ultimate pressure is 4×10-3 [Pa], a sputtering pressure is 0.76 [Pa], a sputtering gas and atmosphere were Ar atmosphere and a gas flow was 20 [sccm].

Below, materials for forming thin films and results of measurement on powers of film formation and time periods of film formation are shown in Table 3 below.

TABLE 3

| Material for forming alloy thin film | Film formation power (ratio) [W] | Film formation time [sec] |
|---|---|---|
| Ag | 500 | 46 |
| Al | 500 | 152 |
| Au | 500 | 122 |
| Ag—Pd | 500 | 55 |
| Ag—Pd Cu | 500(AgPd):45(Cu) | 60 |
| Ag—Pd Ti | 500(AgPd):215(Ti) | 49 |
| Ag—Pd Ta | 500(AgPd):35(Ta) | 60 |
| Ag—Pd Rh | 500(AgPd):45(Rh) | 58 |
| Ag—Pd Cr | 500(AgPd):55(Cr) | 57 |
| Ag—Pd Al | 325(AgPd):500(Al) | 84 |
| Ag—Pd Au | 500(AgPd):5.2(Au) | 80 |

As shown in Table 3, in a case where thin films are formed by using an Ag alloy, that is, an AgPd and an AgPdX alloy, of the present invention, a time period for film formation is longer roughly by 10 to 50% than in a case where Ag is singly used, but the time period for film formation can greatly be decreased, compared with etching rates in cases where Al and Au, which are considered to be alternative materials, are respective used.

Then, ways of preparation of a sputtering target material of the present invention were studied. As the ways of preparation of a sputtering target material of the present invention, there can be named two melting methods: to melt in a gas atmosphere and to melt in vacuum.

In a case where an Ag alloy is prepared in a melting method, a master alloy which is a base is first prepared and Ag is additionally mixed into the master alloy, wherein a quantity of additional Ag is adjusted so that a total of Ag is included at a predetermined content in the Ag alloy.

The case where alloy preparation is conducted in a gas atmosphere will be described.

First, in an Ar atmosphere at a pressure in the range of 400 to 600 torr, an Ag—Pd—X alloy, wherein X is one selected from the group consisting of Au, Al, Cu, Ti, Rh and Cr, is molten by arc melting to mix and produce a master alloy.

At this time, compositions of Pd, which is respectively set 10 to 15 atomic % and X, wherein X is Au, Al, Cu, Ti, Rh and Cr, which is respectively set 15 to 20 atomic % of a given quantity of Ag and a mixture is molten.

Then, Ag is molten in a high frequency induction melting furnace, wherein a quantity of the molten Ag is equal to a result obtained when a total requirement is subtracted by an Ag quantity included in the master alloy.

A temperature adopted in the furnace for the melting is, for example, in the range of 1000° to 1500° C. and a regular type graphite crucible of 0.1 to 0.2 liter, for example, is used.

Ag is fully molten and thereafter, an antioxidant is added into the molten Ag to suppress and prevent oxygen in the molten Ag from being occluded when solidified. As antioxidants, there can be used materials such as borax, sodium borate, lithium borate and carbon.

The Ag with an antioxidant added is left for about 1 hour in a fully molten state and thereafter, the above described master alloy is added to the melt and the mixture is kept in a molten state for another 0.5 to 1 hours, wherein temperatures in the molten states are adjusted, for example, in the range of 10500 to 2000° C.

Then, a molten mass is poured into a Fe mold whose inner surface is applied with, for example, alumina or magnesium based talc.

The Fe mold is heated in advance at a temperature roughly in the range of 3000 to 500° C. in order to prevent a shrinkage cavity from occurring.

The molten mass in the mold is cooled and solidified, then an ingot is taken out from the mold and the ingot is further cooled down to environmental temperature.

A riser portion which is the top part of the ingot is cut and removed, the rest ingot is rolled by a roller to prepare an alloy plate of 90 mm×90 mm×8.1 mm.

Thereafter, the alloy plate is heated, for example, in an electric furnace in an sealed condition with Ar gas being filled in at temperature in the range of 400° to 500° C. roughly for 1 to 1.5 hours and then warpage correction is conducted by a press.

The plate after the warpage correction is subjected to wire cutting into a product shape, the product is polished across the entire surface by using water-proof abrasive paper to adjust a surface roughness. An Ag alloy sputtering target material of the present invention can finally be produced.

As described above, in a case where the Ag alloy sputtering target material of the present invention is prepared and in the preparation, Ag is molten while Pd and other elements X are added, an easy way that has heretofore been adopted can also employed, which leads to a great merit in cost and production method.

While, in the above described examples, the following alloys are described: in Table 2, for examples, Pd is added to Ag at a content in the range of 0.5 to 4.9 atomic % and Cu and Cr are further added thereto at contents in the range of 0.1 to 3.5 atomic % each and for the others, Pd is added to Ag at a content in the range of 0.5 to 1.5 atomic % and Ti is further added thereto at a content in the range of 0.1 to 2.9 atomic %, the present invention is not limited to the examples, but can be applied to cases where other elements of Au, Al and Rh are used. That is, in cases where a part of Ag included in an AgPd alloy is replaced by using Au, Al and Rh to prepare an alloy and with the alloy, a thin film of an optical recording medium is formed, a high reflectivity is confirmed to be achieved and furthermore, a sputtering target material, a thin film for an optical recording medium and an optical recording medium with respective excellent effects can be produced similar to cases where alloys are prepared by using Cu, Ti and Cr added.

A sputtering target material of the present invention can secure high resistances to oxygen, sulfur, chlorine and others, compared with Ag, and when a thin film is formed with the target material having such high resistances, a high quality optical recording medium can be obtained by using the thin film, with which deterioration in reproduction signal can be avoided from occurring over a long time period.

A thin film formed by using a sputtering target material of the present invention and an optical recording medium including the thin film can secure a high reflectivity of 88% or higher in a case where a wavelength is less than 800 nm is used and thereby a good reproduction signal can be obtained, which in turn entails realization of a high quality optical recording medium.

In a case where an AgPd alloy sputtering target material of the present invention is used to deposit a thin film by a sputtering method, it has been found that a sputtering rate is not decreased so much, as compared with a case where Ag is singly used to deposit a thin film by the sputtering method, and besides, the AgPd alloy sputtering target material is more excellent in sputtering rate than Au and Al as alternative materials.

A sputtering target material of the present invention can be produced as a product by a simple and easy method which has heretofore been adopted and besides, enables thin film formation for an optical recording medium to be performed by a sputtering method with ease.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A method of forming a thin film comprising the step of: forming an AgPdTi alloy thin film using a sputtering target material, the AgPdTi alloy comprising Pd in an amount ranging from 0.1 to 1.5 atomic %, Ti in an amount ranging from 0.1 to 2.9 atomic %, and Cu in an amount ranging from 0.1 to 3.5 atomic %.

2. The method of claim 1, wherein the thin film has a thickness from approximately 500 Angstroms to approximately 1500 Angstroms.

3. The method of claim 1, further comprising irradiating an information recording layer with a light beam having a wavelength less than or equal to 650 nm.

4. The method of claim 3, wherein the thin film has a thickness from approximately 500 Angstroms to approximately 1500 Angstroms; and wherein the wavelength is less than or equal to 650 nm.

* * * * *